(12) United States Patent
Marshall

(10) Patent No.: US 8,936,683 B2
(45) Date of Patent: Jan. 20, 2015

(54) SYNTHETIC OPAL AND PHOTONIC CRYSTAL

(76) Inventor: Robert A. Marshall, Georgetown, TX (US)

( * ) Notice: Subject to any disclaimer, the term of this patent is extended or adjusted under 35 U.S.C. 154(b) by 1886 days.

(21) Appl. No.: 11/049,025

(22) Filed: Feb. 2, 2005

(65) Prior Publication Data

US 2005/0166837 A1 Aug. 4, 2005

(51) Int. Cl.
*C30B 35/00* (2006.01)
*C30B 29/00* (2006.01)
*C30B 5/00* (2006.01)

(52) U.S. Cl.
CPC .. *C30B 29/00* (2013.01); *C30B 5/00* (2013.01)
USPC ........................................................ 117/200

(58) Field of Classification Search
USPC ............ 117/200; 264/1.21, 1.36, 71, 72, 235, 264/346, 1.1, 1.7, 2.6, 69; 210/748; 359/341.5
See application file for complete search history.

(56) References Cited

U.S. PATENT DOCUMENTS

| | | | |
|---|---|---|---|
| 5,998,298 A | 12/1999 | Fleming et al. | |
| 6,139,626 A | 10/2000 | Norris et al. | |
| 6,297,496 B1 | 10/2001 | Lin et al. | |
| 6,325,957 B1 * | 12/2001 | Kumacheva et al. | 264/71 |
| 6,358,854 B1 | 3/2002 | Fleming et al. | |
| 6,388,795 B1 | 5/2002 | Fleming et al. | |
| 6,409,907 B1 * | 6/2002 | Braun et al. | 205/317 |
| 6,414,332 B1 | 7/2002 | Lin et al. | |
| 6,517,763 B1 | 2/2003 | Zakhidov et al. | |
| 6,611,085 B1 | 8/2003 | Gee et al. | |
| 6,768,256 B1 | 7/2004 | Fleming et al. | |
| 6,812,482 B2 | 11/2004 | Fleming et al. | |
| 2003/0148088 A1 | 8/2003 | Padmanabhan | |
| 2003/0156319 A1 * | 8/2003 | John et al. | 359/341.5 |
| 2004/0118339 A1 | 6/2004 | Papadimitrakopoulous | |

FOREIGN PATENT DOCUMENTS

WO PCT/US2006/003829 2/2006

OTHER PUBLICATIONS

Saado et al. "Self-assembled heterostructures based on magnetic particles for photonic bandgap applications"; Optical Materials 17 (2001).*
Helseth, Self Assembly of Colloidal Pyramids in Magnetic Fields, Langmuir, v21, p. 7276-7279, 2005.
Skjeltorp, One- and Two Dimensional Crystallization of Magnetic Holes, Physical Review Letters, v51, p. 3609, 1983.

* cited by examiner

*Primary Examiner* — Larry Thrower

(57) ABSTRACT

A colloidal suspension of particles is rapidly self-assembled with a minimum number of defects into a densely packed array of particles on a substrate under simultaneous sedimentation and annealing forces. The particles may be ordered as an opal structure. Optionally, the synthesized structure may incorporate an electrolyte and be used as a sacrificial form for micromolding an inverse structure. The inverse structure may exhibit a photonic band gap. Optionally, necking between particles may be adjusted after micromolding. Furthermore, a shell may alter physical properties, such as protecting a thermally stimulated photonic band gap device. These low cost methods allow more applications to become commercially viable.

15 Claims, 4 Drawing Sheets

SYNTHETIC OPAL AND PHOTONIC CRYSTAL

TECHNICAL FIELD OF THE INVENTION

This invention relates generally to the fields of photonics and microfabrication, more specifically to a system and method to fabricate synthetic opal structures, inverse opal structures, and inverse opal photonic band gap crystals.

BACKGROUND OF THE INVENTION

A Photonic Crystal (PC) is a microstructured material with wavelength- and angle-dependent optical properties. For a Photonic Band Gap (PBG) to exist within a PC, the allowed quantum energy bands must not overlap for some area, and that gap area is the PBG. The PBG may exist in one, two, or three dimensions and in TE and/or TM modes. A complete 3-D PBG is a gap in the allowed quantum states across all propagation directions and polarization modes. The band gap position and gap width may be easily modified to yield desired photonic properties by varying crystal parameters, such as: structural geometry, crystal lattice dimensions, or contrast of indices of refraction between the composite material and vacuum/air. PBG properties are generally fully established within only a few lattice constants. Because of these properties, PBGs are attractive for sharp filters and lossless waveguides in both telecommunication and optical computing applications. Since certain wavelengths cannot propagate, the PBGs' optical emissions are centered in the band of interest and not spread over a wide spectrum as with a blackbody. Therefore, thermal stimulation of PBGs can benefit lighting and ThermoPhotoVoltaic (TPV) applications. An in-depth overview of PCs, PBGs, and fabrication methods can be found at: Cefe Lopez, "Materials Aspects of Photonic Crystals", Advanced Materials 15, p1679 (2003) or http://ab-initio.mit.edu/photons/tutorial/.

A complete 3-D PBG may exist in a variety of PC structures. One such structure is a stacked array of rods, known as a woodpile structure. Woodpile structures are fabricated using nanolithographic techniques modified from well-known semiconductor processes. These structures must be painstakingly assembled one layer at a time. For each layer, one must create a pattern, etch a mould, fill a mould, and polish that layer into a plane. In addition, for visible emission applications, feature size is on the order of 100 nm, requiring state-of-the-art lithography and exceptional layer-to-layer registration quality control. This method is too costly in terms of time, capital, and material to be suitable for most applications. Further reference is available at U.S. Pat. No. 6,358,854 B1 "Method to fabricate layered material compositions".

Another complete 3-D PBG structure is an inverse opal. An inverse opal is the volumetric inverse of an opal. An opal, which is a PC structure without a PBG, is a closely packed array of uniformly sized spheres. An inverse opal is built by using an opal as a form and filling the residual (interstitial) volume between the spheres themselves with a material whose refractive index contrast to vacuum/air is high. For visible or near-IR light emission applications, the lattice size required is in the range of 400 nm to 1 μm. Unfortunately, there are currently few suitable materials within this size range. Molecular-based templates are too small, while traditional mechanical manipulations are too large, although they can be useful in microwave applications. Even though natural opal gemstones are of about the right particle diameter, they are impractical due to: too small of crystal domain size, particle size variations, limited availability, and extremely high cost.

Since there are limited templates available that are suitable for micromoulding, one must be synthesized. One method to synthesize an opal structure is via a controlled withdrawal process: taking a colloidal suspension of spheres (typically silica or polystyrene), inserting a substrate into the suspension in order to create a meniscus line, and then slowly evaporating the suspending agent (typically water). The surface tension of the evaporating water at the top of the meniscus line pulls the spheres into a closely packed array no more than a few layers thick, leaving an opal structure of spheres. This is a slow process, taking days to months to grow a sample of commercially useful size and quality. Faster withdrawal of the substrate results in faster growth rates but at the expense of more defects. Another synthesis process includes ultra-centrifuging a suspension of spheres to produce an opal sediment. The centrifugal force packs the spheres into a closely packed array at the bottom of the centrifuge tube. As a result, the sediment is very thick and does not cover a large surface area. Since PBG properties are fully developed in only a few lattice constants, thick structures not only cost more due to additional material but also offer no benefit since most applications desire a thin sediment over a relatively larger surface area. Yet another opal synthesis process includes a self-assembly sedimentation process using electrophoresis. A suspension of surface-charged spheres is placed between two plates, and as a voltage is applied between the two plates, the charged spheres are attracted toward the oppositely charged electrode, thereby modifying the sedimentation rate. If the resultant sedimentation rate is too slow, an opal sediment will still be formed, but very slowly. If the resultant sedimentation rate is fast, the sedimentation time will be decreased but at the expense of increased dislocation defects and smaller domain size. If the resultant sedimentation rate is even faster, the sediment will be a random sludge. This process is further described in US 2003/0,156,319 A1 "Photonic Bandgap Materials Based on Silicon". In all of the above opal structure fabrication methods, high quality samples take a very long time to grow; however, lower quality samples can be grown faster. Large samples are on the order of only a few square centimeters. Another limitation is that the opals are very fragile, easily damaged by handling and by shrinkage during drying. The opal structures must be dried before they are inverted. Necking adds structural stability. Silica opals are necked by drying the opal structure and then sintering, slightly melting the spheres such that they partly fuse together. Necking has the added benefit of subsequently optimizing the width of the band gap. Therefore, a system and method to fabricate opal structures quickly, with low defects, large domain size, and at low cost is needed.

An inverse opal structure can be formed from a synthesized opal structure in several ways. One such method starts with a self-assembled opal structure made with silica spheres. Then, a Chemical Vapor Deposition (CVD) of Si, Ge, or other metal is applied in the interstitial spaces between the spheres, and the silica spheres are then etched out with a hydrofluoric acid solution. This process does not completely fill the interstitial spaces, creating only an optically thin layer of material or 'eggshell' around the spheres. Thicker shells are possible, but require notably longer deposition times. Thin materials are fragile and are not thermally conductive. Other limitations include: the use of toxic CVD gasses and hydrofluoric acid as well as the need for vacuum during processing. This example selection of inverse opal materials exhibits a complete 3-D PBG. Further reference is found at "Self-assembly lights up"; Nature; Nov. 15, 2001.

Another inverse opal structure is formed around a polystyrene opal structure. An electroplating electrolyte is infiltrated into the interstitial spaces between the spheres; a CdSe alloy is electro-deposited; and, subsequently, the spheres are removed by dissolution in toluene. The result is a CdSe inverse opal PBG crystal. One disadvantage is the risk of damage to the opal structure when the electrolyte is infiltrated. Further reference is made in "Electrochemically grown photonic crystals"; Nature; Dec. 9, 1999. Therefore, a system and method for high quality, low-cost inverse opal structures and inverse opal PBG crystals is needed.

Thermal stimulation of a PBG device benefits applications including: lighting, TPV power generation, and thermal signature modification. Since PBG devices modify the available quantum mechanical states within the structure, when thermally stimulated to around 1000° C., they do not behave as black bodies but have a more narrowband optical emission. The quantum mechanical form of Plank's law still applies. As with any thermal stimulation, the radiated energy is not coherent. Attempts to thermally stimulate existing PBG structures have limitations. A tungsten woodpile structure has been thermally stimulated in U.S. Pat. No. 6,583,350 "Thermophotovoltaic energy conversion using photonic bandgap selective emitters". However, fabrication of a woodpile structure is too costly to be commercially accepted in a commodity market. An 'eggshell' CVD inverse opal structure suffers from a high thermal resistance, making it more difficult to thermally stimulate. This structure also lacks a substrate, which is required in direct heating applications. The electrodeposited CdSe inverse opal structure will melt at high temperature and will evaporate in high vacuum. Therefore, a system and method for a high temperature, low vapor pressure, high quality, low-cost inverse opal PBG crystals is needed.

SUMMARY OF THE INVENTION

In accordance with the present invention, a system and method to fabricate synthetic opal structures, a system and method to fabricate inverse opal structures, and a system and method to fabricate inverse opal PBG crystals are provided which address disadvantages and problems associated with other systems and methods.

An opal structure is fabricated from a colloidal suspension of uniformly sized polystyrene spheres placed under the influence of both electric and magnetic fields simultaneously. The spheres have a surface charge and are paramagnetic. The purpose of the electric field is to quickly sediment an opal structure. However, it is well known that opal sedimentation speed is inversely proportional to quality. So, a damped oscillatory magnetic field is concurrently applied to remove defects during accelerated sedimentation. As the electric field rapidly sediments the spheres, the magnetic field shakes and aligns the particles, further aiding them into the densest possible structure, an opal. An advantage is that defects from the rapid sedimentation are quickly and effectively annealed out, resulting in an opal crystal with both high quality and a high speed of formation. This reduces fabrication costs. In alternate embodiments, other sphere materials, sphere surface chemistries, suspension solution chemistries, and applied sedimentation and annealing forces are envisioned. In other alternate embodiments, the sedimenting and annealing forces may be combinations of electric, magnetic, gravitational, thermal, centrifugal, or other force fields.

An inverse opal structure is created by electrodepositing a metal within the opal micromould form and then removing the template. The metal may be any metal, metal alloy, or other chemical composition with a high index of refraction in contrast with vacuum/air. For an optimum plating method, the colloidal suspension of spheres used when forming the opal mould must have included an electroplating electrolyte. Because the electrolyte is present during sedimentation, the applied electric potential for sedimentation must be limited to below the work function of the electrolytic deposition reaction to prevent electrodeposition of the metal during formation of the opal structure itself. Another disadvantage is that the electrolyte changes the colloid stability and appropriate adjustments must be made. An advantage is that since the electrolyte has already infiltrated the interstitial space between the spheres, a separate infiltration step, drying, and further handling are not necessary, thereby reducing the risk of damage. Another advantage is that this method does not require the use of toxic CVD gasses or hydrofluoric acid, nor the use of vacuum pressures during fabrication. Yet another advantage is polystyrene spheres are readily manufactured with magnetic cores and easily dissolved by toluene or may be removed by sintering. In alternative embodiments, electroless deposition is used.

The inverse opal structure formed may not have the desired PBG properties. It is well known that changing lattice parameters by necking can optimize the band width of the band gap. Necking between the spheres can be achieved by chemically etching the inverse opal. In alternative embodiments, Physical Vapor Deposition (PVD) may be used to remove some material within the inverse opal, widening the necks between spheres. If an artificial opal gemstone or inverse opal is desired, well known methods may be used to fuse the opal structure for desired mechanical integrity or necking.

Optionally, a shell may be deposited over the necked inverse opal structure. If the inverse opal PBG crystal is intended to be thermally stimulated for narrowband light emissions, shell materials are selected for a high melting point, low vapor pressure, and compatibility as a diffusion barrier, to protect the core material. An advantage is the core may consist of a higher vapor pressure material that is easy to electroplate yet would evaporate without the protection of the shell. Another advantage of using a lower index of refraction shell over a higher index of refraction core is that the effective index of refraction contrast is higher versus a structure using only the lower index of refraction material. For chemical or biological applications of opal structures or inverse opal structures, the shell may be selected to give desired surface properties.

Low cost, high quality opal structures, inverse opal structures, and inverse opal PBG crystals are needed to enable mass production of these structures, which would allow many more applications to become commercially viable. Some applications which may benefit include: low cost photonic crystals including lighting and TPV applications; other photonic crystal applications including: thermal emission modification, filters, prisms, negative refraction index surfaces, and lasers; chemical and mechanical functions including: chemical sensors, temperature sensors, chemical separation processes, gas storage, colorants, catalytic supports and surfaces, lightweight structural materials; thermal and acoustic insulators; electrical functions such as: low dielectric materials, thermoelectrics, and thermionics; and synthetic gemstones.

Other technical advantages are readily apparent to one skilled in the art from the following figures, descriptions, and claims.

BRIEF DESCRIPTION OF THE DRAWINGS

For a more complete understanding of the invention, and for further features and advantages, reference is now made to the following detailed description, taken in conjunction with the accompanying drawings, in which.

DETAILED DESCRIPTION OF EMBODIMENTS OF THE INVENTION

Figure 1A:
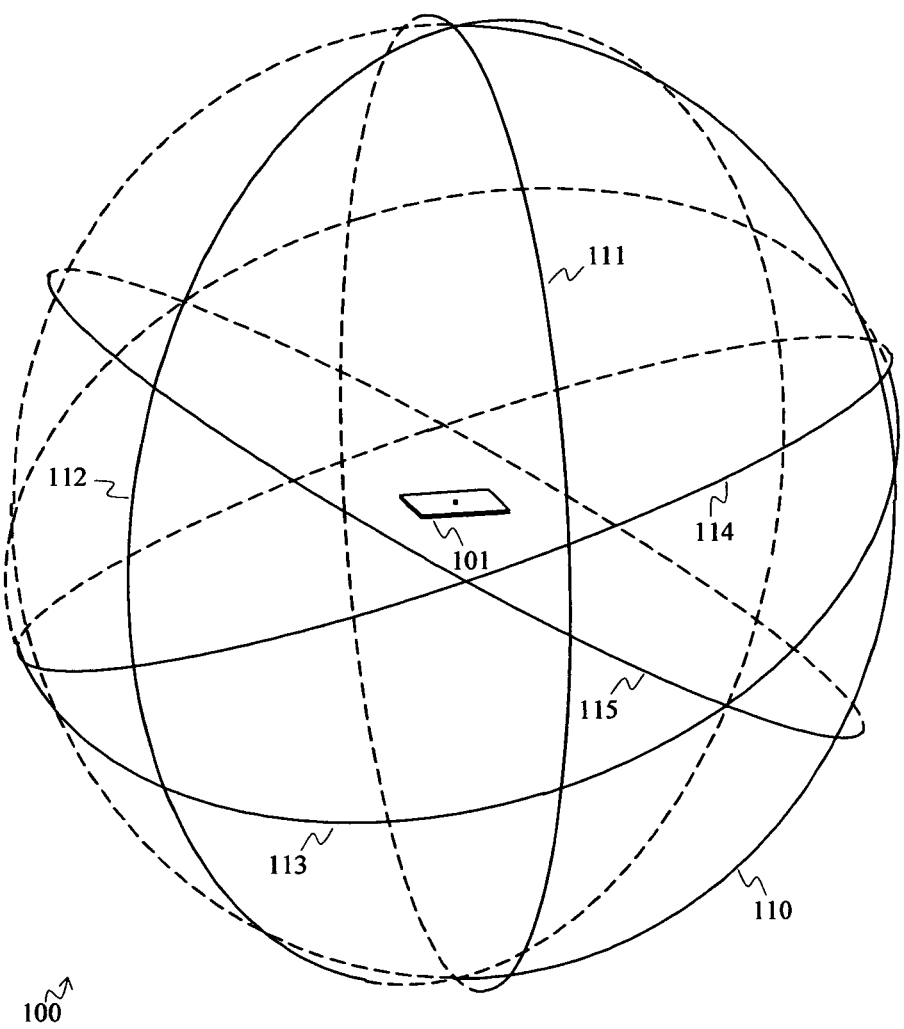
FIG. 1A is a diagram illustrating a perspective view of a self-assembly cell.
Figure 1B:
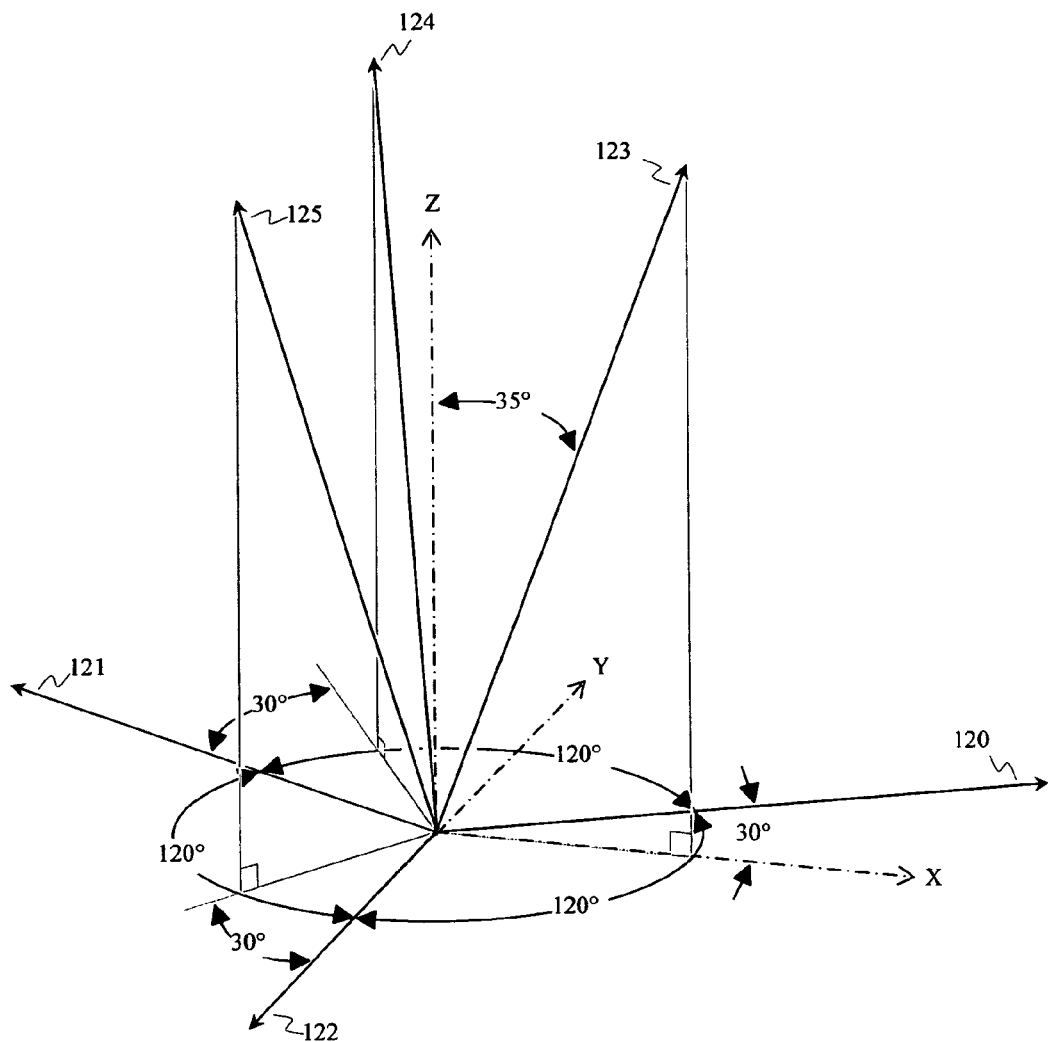
FIG. 1B is a perspective diagram indicating the axes of said self-assembly cell.
Figure 2:
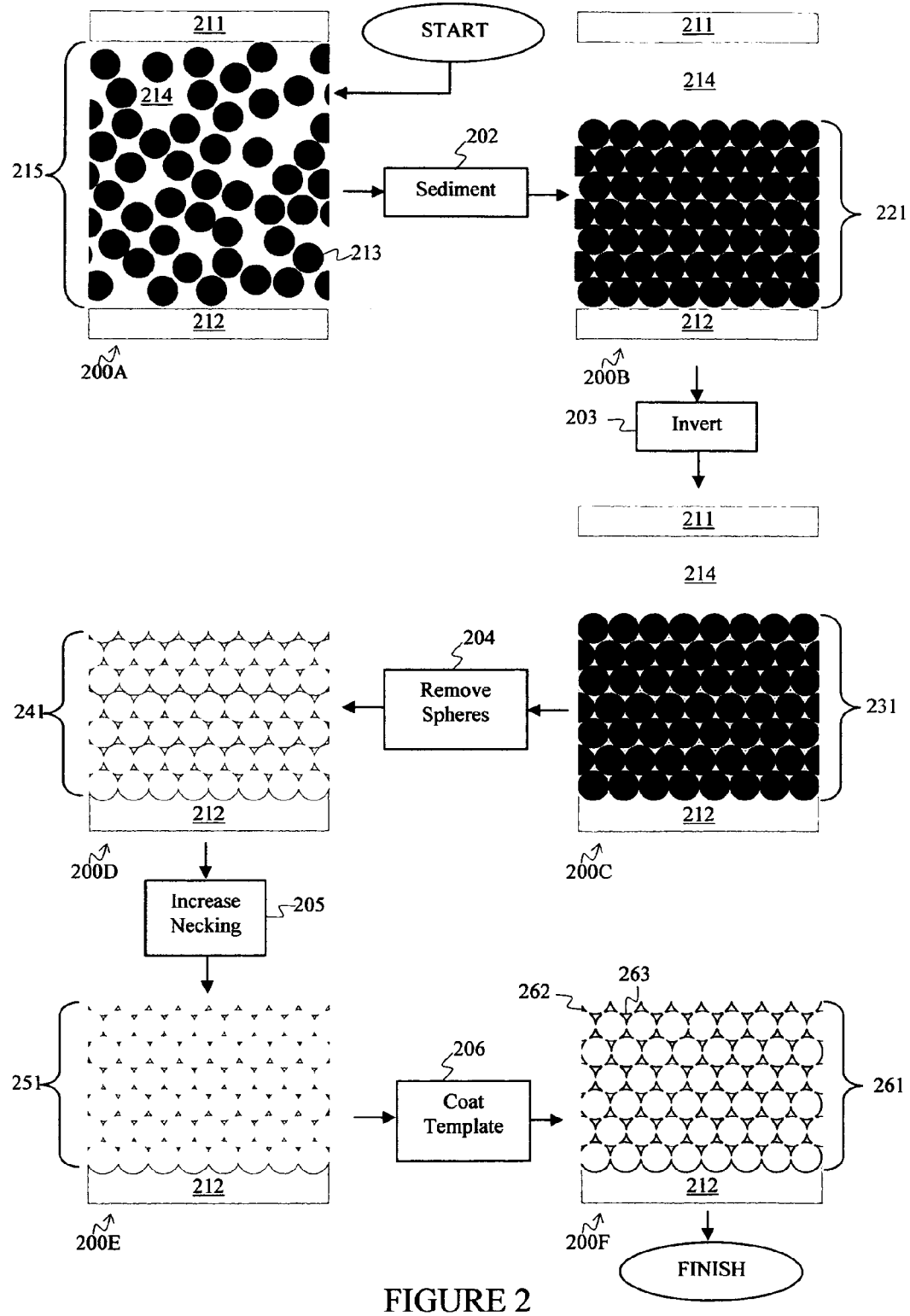
FIG. 2 is a flowchart with diagrams illustrating the side view of an electroplated inverse opal PBG crystal during fabrication.
Figure 3:
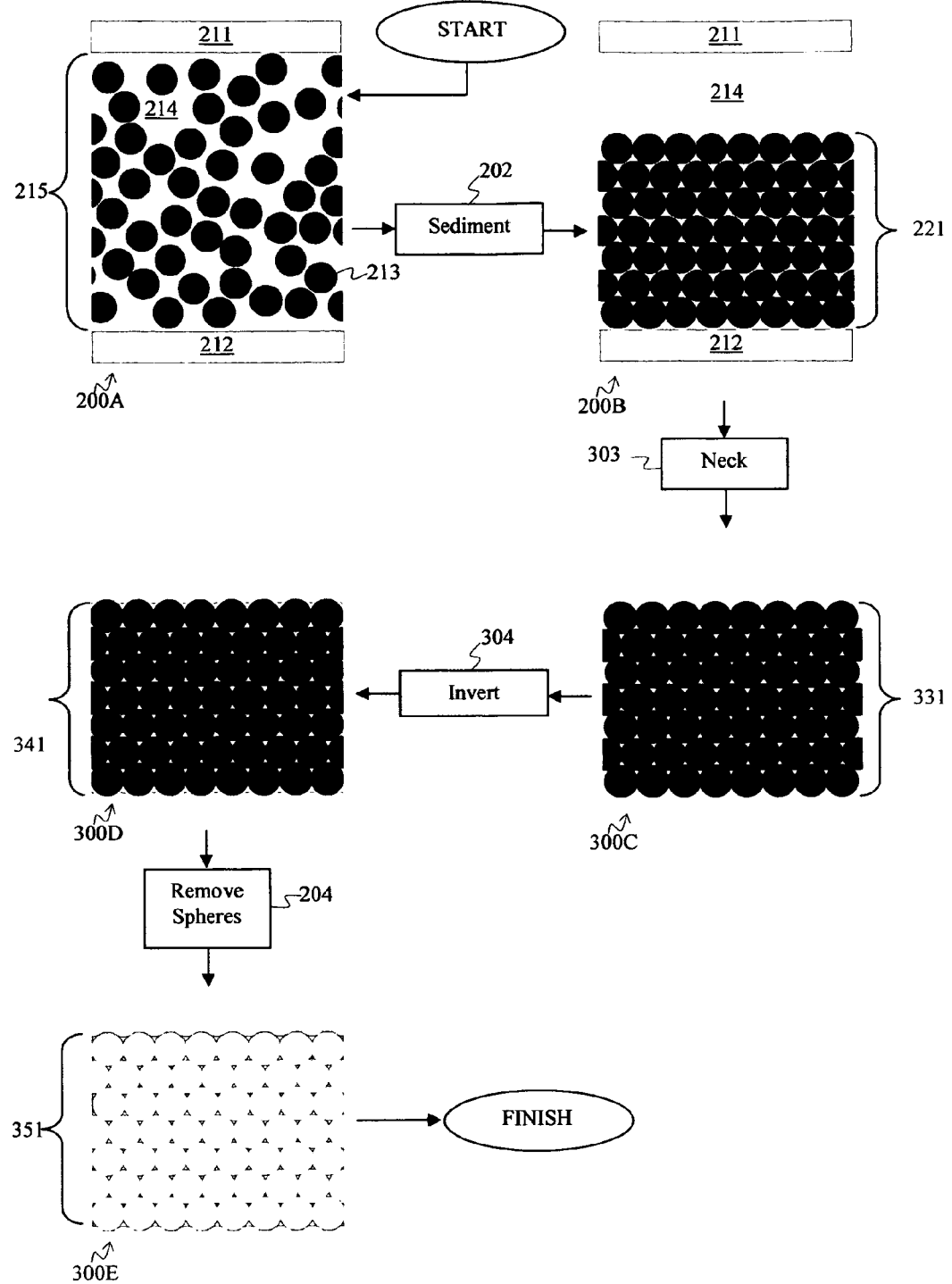
FIG. 3 is a flowchart with diagrams illustrating the side view of a CVD inverse opal PBG crystal during fabrication, in accordance with the present invention.

Embodiments of the present invention and their advantages are best understood by referring to FIGS. 1 through 3 of the drawings, in which like numerals refer to like parts.

FIG. 1A is a diagram illustrating a perspective view of self-assembly cell 100. FIG. 1B is a perspective diagram indicating the axes of self-assembly cell 100. Self-assembly cell 100 has six yoke electromagnets 110 through 115 oriented along axes 120 through 125 to apply a magnetic force corresponding to the vector addition of the applied fields. Axes 120 through 125 correspond to the well-known crystallographic axes of an opal structure. The direction of the magnetic field is electrically modulated between electromagnets 110 through 115. Alternatively, a single electromagnet may be used and mechanically rotated to the desired direction. Sample 101 is located at the center of self-assembly cell 100.

FIG. 2 is a flowchart with diagrams illustrating the side view of an electroplated inverse opal PBG crystal during fabrication. FIG. 2 is for illustrative purposes and is not to scale. Sample 200A through 200F are exploded views of sample 101.

Sample 200A contains colloidal suspension 215 between cathode 212 and anode 211. Colloidal suspension 215 comprises suspending agent 214 and spheres 213. The sedimentation rate can be changed by adjusting the zeta potential, viscosity, or specific gravity of colloidal suspension 215. Zeta potential can be adjusted with changes in pH, ions, and with surface chemistry, such as a surfactant. Suspending agent 214 may be an electroplating electrolyte, or water if an opal structure is the final embodiment. Suspending agent 214 may be adjusted for the desired electroplating properties. A disadvantage is that the colloid stability must be adjusted to compensate for the electroplating properties. Spheres 213 are monodisperse, polystyrene-coated, paramagnetic, carboxylic-acid-terminated spheres. Selected sphere diameter is generally in the range of 300 nm to 2 μm, depending on the optical wavelengths desired. Such spheres are well known for their use in biological separations. In an alternate embodiment, surface termination of spheres 213 may be substituted for epoxy or any other suitable material. In an alternate embodiment, spheres 213 may contain silica or other material.

In step 202, spheres 213 are sedimented by applying an electric field between cathode 212 and anode 211. The applied sedimentation (electrophoresis) potential must be kept less than the electrodeposition voltage. With a low pH, required for a subsequent electroplating process, spheres 213 have a positive zeta potential and are attracted to cathode 212. A mass of spheres 213 accumulates at cathode 212 and orders into an opal structure over small domain sizes. Spheres 213 prefer to organize into an opal structure, as it provides the lowest free energy potential. Faster sedimentation rates result in many smaller domains simultaneously growing. Insufficient energy is available to merge two established domains. Embedded defects create a deeper energy well than surface defects. Once spheres 213 are closely packed, a stable structure exists when attractive van der Waals forces are greater than repulsive electric double layer forces, making defect removal require even higher energy. An oscillatory magnetic field is simultaneously applied with electromagnets 110 through 115 during sedimentation to provide sufficient energy to overcome the energy wells created by defects arising from fast sedimentation, thereby annealing out defects. The magnetic field is spatially swept, with preference to planes corresponding to crystallographic axes. This annealing field is key to maintaining a low defect rate while maintaining a fast sedimentation rate, annealing out defects before they become buried within the crystal. An annealing force along a crystallographic axis will integrate two misaligned domains, remove a line defects, and remove point defects. This results in sample 200B. In alternate embodiments, the sedimentation and annealing fields may be substituted for or combined with mechanical agitation or gravitational, centrifugal, or thermal fields, depending on the type of particle selected, so long as a sedimentation force and an annealing force are maintained. For example, an electric field may serve as both a sedimenting field and an annealing field, if the field vector generally points toward the substrate, but is varied in magnitude and direction with preference for the crystallographic axes of the crystal.

In sample 200B, all of spheres 213, have ordered into opal 221. Opal 221 is a PC, but it does not have a PBG. Thickness of opal 221 may be controlled by varying the number of spheres initially in colloidal suspension 215. If a synthetic opal gemstone is the desired outcome, the sample may be dried and fused at this point. In another alternate embodiment, cathode 212 is a wire, a coating on a surface, or formed to any other desired shape. Alternatively, suspending agent 214 may be confined to a container. The shape of the container may be that of an optical waveguide, optical coupler, optical splitter, or other structure. In another alternate embodiment, all of or a fraction of spheres 213 are substituted with another diameter spherical particle, a non-spherical particle, a particle with different surface charge, a particle with different sign of surface charge, or a particle with different binding affinity; resulting in alternate structures. In yet another alternate embodiment, cathode 212 is micropatterned to grow other non-opal structures of packed spheres on a template, including: hexagonal close packed, face centered cubic, body center cubic, diamond lattice, and the hexagonal $AB_2$ structure. Some structures, such as an opal, do not require a template.

In step 203, opal 221 is inverted. A metal or metal alloy is electrodeposited, completely filling the interstitial gaps of opal 221, forming inverted opal with spheres 231 illustrated in sample 200C. The applied electrodeposition voltage does not disrupt opal 221, as the sedimentation voltage is of the same polarity. For PBG applications, the electroplated material should exhibit a high refractive index relative to vacuum/air. In one embodiment, the electrodeposited metal is Cu, selected for its good refractive index, ease of use, and environmental friendliness. In alternate embodiments, the inverting material may be any other desired electroplatable metal, refractory metal, semiconductor alloy, or other well known PBG material. The quality of deposits may be difficult to maintain. Agitation is not possible within the deep recesses of an opal template. Periodic pulse reverse plating helps maintain quality. Reverse plating pulse width must be selected not to disrupt the opal structure. The reverse plating pulse width may be reduced or eliminated by using three pulse levels: positive, zero, and negative. Application of a static magnetic field aids in preventing disruption from the reverse plating pulse. The plated structure is rugged enough to be handled without damage. Advantages include minimizing damage of the opal structure, since: the sample is electroplated without movement from the sedimentation and annealing step, and the electrolyte is infiltrated into the crystal before assembly. Additional advantages include: no voids in the inverted crystal due to incomplete infiltration, use of minimally hazardous materials, and low processing cost. Other micromoulding techniques can be utilized, such as: electroless deposition, powders, chemical precipitation, or chemical conversion.

In step 204, anode 211 is discarded, cathode 212 remains as a substrate, and spheres 213 are removed from inverted opal with spheres 231, resulting in inverse opal 241 with substrate 212. Polystyrene spheres are readily removed with toluene or by sintering. In an alternate embodiment using silica spheres, hydrofluoric acid is required.

Sample 200D shows inverse opal 241 with substrate 212. This structure exhibits a full 3-D PBG. In an alternate embodiment, if an inverse opal without a substrate is desired, substrate 212 must be removed. If so, substrate 212 may be chosen to be a different material from inverse opal 241 and removed by selective etching. A subsequent chemical mechanical polish may be desired, as the layer of inverse opal 241 closest to cathode 212 is incomplete due to surface defects.

In step 205, the necking between cavities is increased to modify the PBG gap width. Some small thickness of material is uniformly removed by chemical etch. For example, Cu can be removed with sodium persulfate. Alternatively, the material can be heated for PVD removal.

Sample 200E shows necked inverse opal 251. If desired PBG and physical parameters have been met, processing is complete. If thermal stimulation is not required, the process is complete.

In step 206, necked inverse opal 251 is coated to improve physical or optical characteristics. Optical characteristics may be improved since a lower physical performance material may be used as the core. Physical characteristics may be improved by deposition of an evaporation barrier. This is especially important in thermally stimulated optical emitters, such as are required in TPV electric generators and for PBG-based incandescent light bulbs. For example, Cu heated to high temperature will rapidly oxidize in air and will evaporate in vacuum. A refractory metal diffusion barrier is deposited over the Cu core, allowing high temperature operation. Alternate embodiments readily use alternative materials in both the shell and the core. In one alternative embodiment, a thin layer of W is deposited over a high index material, such as Ge or GaSb, resulting in a higher index structure than a solid W structure.

Sample 200F shows coated inverse opal 261, including coating 263 over core 262, and cathode 212 as a substrate. This PBG structure may be packaged as required by the application.

FIG. 3 is a flowchart with diagrams illustrating the side view of an alternate embodiment, a CVD inverse opal PBG crystal during fabrication. FIG. 3 is for illustrative purposes and is not to scale.

The initial sample 200A, sedimentation in step 202, and sample 200B are the same as shown under FIG. 2.

Step 303 removes anode 211, dries opal 221, and heats opal 221 to cause fusion at the contact points between spheres 213. The degree of necking introduced influences the mechanical strength and optical properties of the PBG. Polystyrene spheres require minimal heat for fusion. Other sphere materials such as silica require sintering for fusion. In an alternative embodiment, a solvent is introduced, softening spheres 213 to promote necking, and the solvent is then removed by drying. Cathode 212 is required for structural stability during drying and may be removed chemically or mechanically after fusion. The process is complete if an opal is the desired endpoint.

Sample 300C illustrates necked opal 331.

Step 304 inverts necked opal 331 through a well-known CVD process. In alternative embodiments, electroless deposition may be used. This process does not completely fill the interstitial voids between the spheres. This may be an advantage depending on the required optical properties.

Sample 300D illustrates inverted opal with spheres 341.

Step 204 removes the spheres by well known processes. Polystyrene spheres are readily sintered or dissolved by toluene, whereas silica requires hydrofluoric acid.

Sample 300E shows a CVD inverse opal 351.

Although embodiments of the invention and their advantages are described in detail, a person skilled in the art could make various alterations, additions, and omissions without departing from the spirit and scope of the present invention as defined by the appended claims.

What is claimed is:

1. A system for forming an opal crystal including:
   a magnetic suspension including a suspending fluid and colloidal particles;
   a substrate;
   a crystallization cell for simultaneously sedimenting and annealing said crystal including:
      a sedimentation component capable of attracting said particles to said substrate; and
      an annealing component capable of sequentially electromagnetically oscillating said particles along the direction of multiple crystallographic axes.

2. The system of claim 1, where said sedimentation component is capable of electrophoretic sedimentation.

3. The system of claim 1, where said annealing component includes six electromagnets and said direction of oscillation is varied between all six crystallographic axes.

4. The system of claim 1, where said annealing component includes a multitude of electromagnets, each oriented along one of a multitude of crystallographic axes, and the direction of said oscillation is varied between each of said electromagnets.

5. The system of claim 1, further including a crystal stabilization component including a static magnetic field.

6. The system of claim 1, further including an electrodeposition component to form a volumetric inverse of said crystal including:
   incorporating an electrolyte in said suspending fluid prior to said crystallization; and
   electrodepositing a material into interstitial voids between said particles subsequent to said crystallization.

7. The system of claim 1, further including an inversion component to form a volumetric inverse of said crystal including:
   a means to deposit a material between said colloidal particles;
   a means to remove said colloidal particles; and
   an etching means to increase necking between cavities in said inverse.

8. The system of claim 1, further including an inversion component to form a volumetric inverse of said crystal including:
- a means to deposit a material between said colloidal particles;
- a means to remove said colloidal particles; and
- a coating means to form a functional coating over surfaces of said inverse.

9. The system of claim 6, where said inverse possesses a photonic band gap.

10. The system of claim 1, further including an inversion component to form a volumetric inverse of said crystal,
- where the material composition of said volumetric inverse is suitable for operating at temperatures greater than 1000° K.

11. The system of claim 10, where said inverse is at least partially comprised of a refractory metal.

12. The system of claim 1, where said particles are paramagnetic.

13. The system of claim 1, where a single crystal domain has an area greater than 100 square centimeters.

14. The system of claim 1, where said substrate is a wire.

15. The system of claim 6, where said electroplating includes reverse pulse plating.

* * * * *